(12) United States Patent
McLaughlin

(10) Patent No.: US 8,358,709 B2
(45) Date of Patent: *Jan. 22, 2013

(54) METHOD AND APPARATUS FOR TRANSMITTING AND RECEIVING CONVOLUTIONALLY CODED DATA

(75) Inventor: Michael McLaughlin, Dublin (IE)

(73) Assignee: DelaWave Ltd., Dublin (IE)

( * ) Notice: Subject to any disclaimer, the term of this patent is extended or adjusted under 35 U.S.C. 154(b) by 447 days.

This patent is subject to a terminal disclaimer.

(21) Appl. No.: 12/590,124

(22) Filed: Nov. 3, 2009

(65) Prior Publication Data

US 2010/0046603 A1 Feb. 25, 2010

Related U.S. Application Data

(62) Division of application No. 11/309,648, filed on Sep. 5, 2006, now Pat. No. 7,636,397.

(60) Provisional application No. 60/596,178, filed on Sep. 7, 2005.

(51) Int. Cl.
*H04L 27/00* (2006.01)

(52) U.S. Cl. ......... 375/259; 375/295; 714/752; 714/786

(58) Field of Classification Search ................ 375/259, 375/295; 714/752, 786
See application file for complete search history.

(56) References Cited

U.S. PATENT DOCUMENTS

| | | | | | |
|---|---|---|---|---|---|
| 4,922,507 | A | * | 5/1990 | Simon et al. | 375/254 |
| 5,372,802 | A | * | 12/1994 | Barrows et al. | 424/52 |
| 5,570,391 | A | * | 10/1996 | Lin et al. | 375/265 |
| 5,850,420 | A | * | 12/1998 | Guillard et al. | 375/316 |
| 5,912,908 | A | * | 6/1999 | Cesari et al. | 714/795 |
| 6,275,538 | B1 | * | 8/2001 | Ramesh et al. | 375/265 |
| 7,372,802 | B2 | * | 5/2008 | Breiling et al. | 370/206 |

OTHER PUBLICATIONS

J.G. Proakis, Digital Communications, 2nd edition, McGraw Hill Companies, Inc., New York, NY, pp. 466-471, 1989).
M. Welborn, IEEE 802.15-05-0240-02-004a, May 2005.

\* cited by examiner

*Primary Examiner* — Jean B Corrielus
(74) *Attorney, Agent, or Firm* — Jeffrey Van Myers; Joseph Pumo; Aerie A. Pennington

(57) ABSTRACT

A method and apparatus for transmitting and receiving convolutionally coded data in a communication system employing a combination of Pulse Position Modulation (PPM) and Binary Phase Shift Keying (BPSK), wherein the code is selected to have error rate performance that is as good as the best convolutional code used with systems employing only BPSK.

80 Claims, 9 Drawing Sheets

METHOD AND APPARATUS FOR TRANSMITTING AND RECEIVING CONVOLUTIONALLY CODED DATA

CROSS-REFERENCE TO RELATED APPLICATIONS

This application is a divisional of application Ser. No. 11/309,648, filed 5 Sep. 2006 (the "Parent Application"), which issued as U.S. Pat. No. 7,636,397 on 22 Dec. 2009, and hereby claims benefit of the filing date thereof pursuant to 37 CFR §1.78(a). This application is related to Provisional Application Ser. No. 60/596,178, filed 7 Sep. 2005, and hereby claims benefit of the filing date thereof pursuant to 37 CFR §1.78(a)(4).

BACKGROUND OF THE INVENTION

1. Field of the Invention

The present invention relates in general to communications systems, and more specifically to transmitters and/or receivers utilizing encoded data.

2. Description of the Related Art

Convolutional Coding of Data

It is well known by those skilled in the art, that convolutional coding of transmitted data gives a bit error rate benefit in the receiver compared to uncoded data for the same amount of received noise. A convolutional encoder is implemented by passing the information sequence to be transmitted through a linear finite state shift register. The number of stages in the shift register is called the constraint length as is often denoted by K. In, for example, a rate 1/R code, the binary input data to the coder is shifted into and along the shift register 1 bit at a time. The number of output bits for each input bit is R bits. Some of the bits in the stages of the shift register are exclusive OR'ed together to give the coded bits. A shorthand for denoting which bits are exclusive OR'ed is to use a binary data word, e.g., if bit 0, bit 3 and bit 4 were exclusive OR'ed together to give the first coded bit, the shorthand would be 10011. This is usually converted to the octal base to give the octal value of the generator as 23. For a rate 1/R convolutional code, there are R such generators. In the example shown in FIG. 6, this rate 1/2 code, K=2 code has the octal values of the generators are (3, 2).

Binary Phase Shift Keying

The coded bits of a convolutional code are then often transmitted using Binary Phase Shift Keying or BPSK. In BPSK, some arbitrary signal is sent to indicate a binary one and the negative of this signal is sent to indicate a binary zero. The probability of error in a BPSK system is lower for larger signals are because noise or distortion has to move the signal further from its correct shape to make it look more like the wrong signal. An important measure here is the squared Euclidean distance (SED) between the positive and negative signals, and it is usually equal to twice the energy of the individual signals.

If a convolutional code is optimally decoded, the equivalent of the BPSK SED is usually denoted by $d_{free}$ or just dfree. In this case, this is the SED between the nearest two sequences, rather than the individual signals. The magnitude of dfree is usually found by starting at a particular state, usually state zero, and measuring the SED between the path that stays at state zero and all the possible paths that come back to state zero. The search can be terminated along a particular path if the SED along that path exceeds the minimum found so far. Tables of generators for convolutional codes that have the largest dfree can be found in many communication theory textbooks, e.g., J. G. Proakis (*Digital Communications* 2nd edition, McGraw Hill Companies, Inc., New York, N.Y., pp. 466-471, 1989) ("Proakis").

Combined BPSK and PPM

It has been suggested, e.g., in the submission by M. Welborn to the IEEE 802 TG4a alternate PHY task group in document IEEE 802.15-05-0240-02-004a (May 2005) ("Welborn") that combined PPM and BPSK can be used so that both a non-coherent and a coherent receiver can receive a signal, albeit with different levels of protection against noise. In the more usual BPSK encoder, the coded bits are mapped directly onto a BPSK signal so that, e.g., zero is mapped onto a certain signal and one onto the negative of this signal, i.e., the alternative signals representing one and zero are antipodal. If, for example, the coded bits are taken in pairs or dibits, the mapping would be like that given in Table 1.

TABLE 1

| BPSK or Antipodal Mapping | | |
|---|---|---|
| Coded dibits | Mapped onto | Distance to 00 dibit |
| 0 0 | −Signal followed by −Signal | 0 |
| 0 1 | −Signal followed by +Signal | 1 × MinD |
| 1 0 | +Signal followed by −Signal | 1 × MinD |
| 1 1 | +Signal followed by +Signal | 2 × MinD |

With the scheme outlined in Welborn pairs of bits would be mapped so that one of the bits determines the position of the signal and the other gives the sign.

TABLE 2

| Combined PPM and BPSK non-antipodal Mapping | | |
|---|---|---|
| Coded dibits | Mapped onto | Distance to 00 dibit |
| 00 | −Signal followed by silence | 0 |
| 01 | +Signal followed by silence | 2 × MinD |
| 10 | silence followed by −Signal | 1 × MinD |
| 11 | silence followed by +Signal | 1 × MinD |

The advantage of this over the pure BPSK type mapping is that one of the bits determines the position of the signal and the other determines the sign. This allows the original signal to be decoded with just position information. A non-coherent receiver has no phase information so it cannot tell if the signal is positive or negative, i.e., the sign of the signal. It does however have information about the magnitude, so it can tell the position. If the inverse operation to the exclusive OR is performed on this position bit, the original uncoded information bit can be recovered.

A further enhancement of the system, which simplifies the non-coherent receiver, is to use a systematic code, i.e., a code where one of the coded bits is actually a delayed version of the information bits and use this bit to encode the position. In this way the non-coherent receiver can directly recover the information by correctly decoding the position of the signal.

A coherent receiver can infer both the position and sign of the signal and so can tell the distance the receive signal is from each of the 4 possible signals which represent the 4 possible dibits. A Viterbi decoder can use this in a soft decoding algorithm to get the full benefit of the convolutional code and thus optimally decode the signal.

BRIEF SUMMARY OF THE INVENTION

Brief Description of the Several Views of the Drawings

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION OF THE INVENTION

Figure 1:
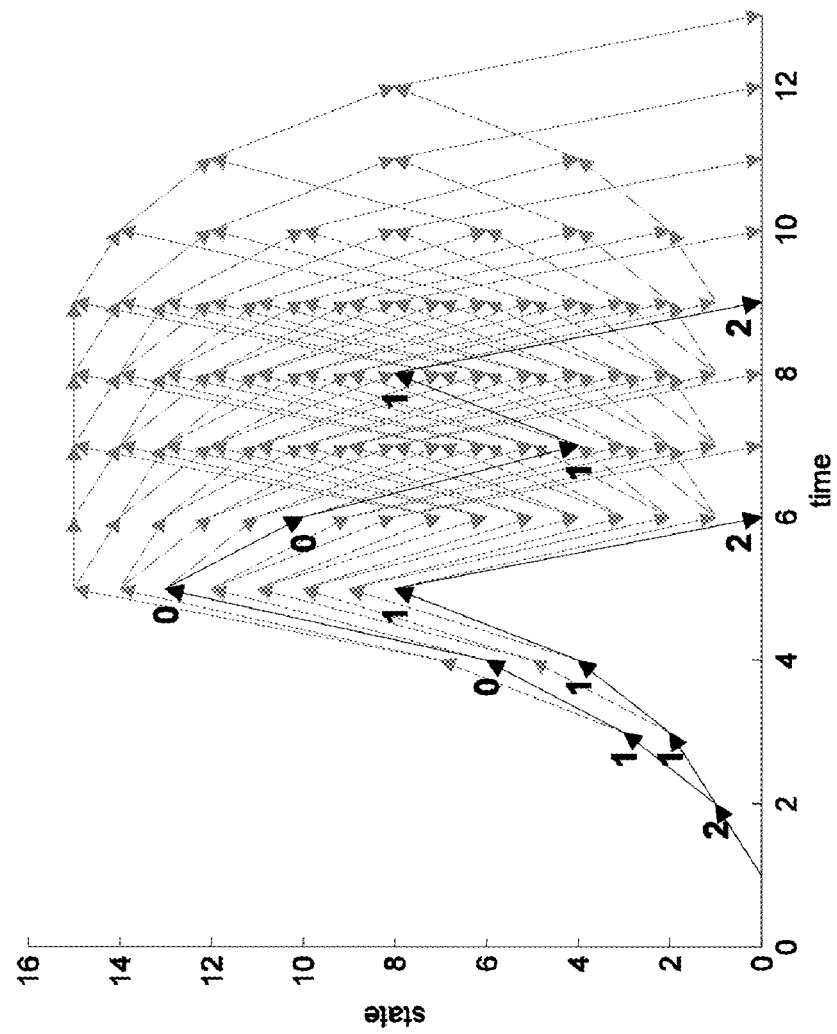
FIG. 1 is a diagram illustrating the state transitions for a typical non-systematic convolutional code where the bits are transmitted using Binary Shift Phase Keying with an antipodal constellation.

One disadvantage of the combined PPM and BPSK scheme outlined above is that conventional convolutional codes were designed with BPSK mapping in mind. FIG. 1 shows an example of the minimum path distance, dfree, of a convolutional code with constraint length K=5. This is a commonly used, optimal rate 1/2 code for K=5 with octal generators (23, 35). This is sometimes known as a trellis diagram. In FIG. 1, the minimum distance paths are highlighted by using a thicker arrow and the distance for each stage is noted near the arrow head. We can see from FIG. 1 that dfree is 7 and that there are two parallel paths, each with a distance of 7 (2+1+1+1+2; 2+1+0+0+0+1+1+2). The fewer paths there are the better is the performance of the code.

Figure 2:
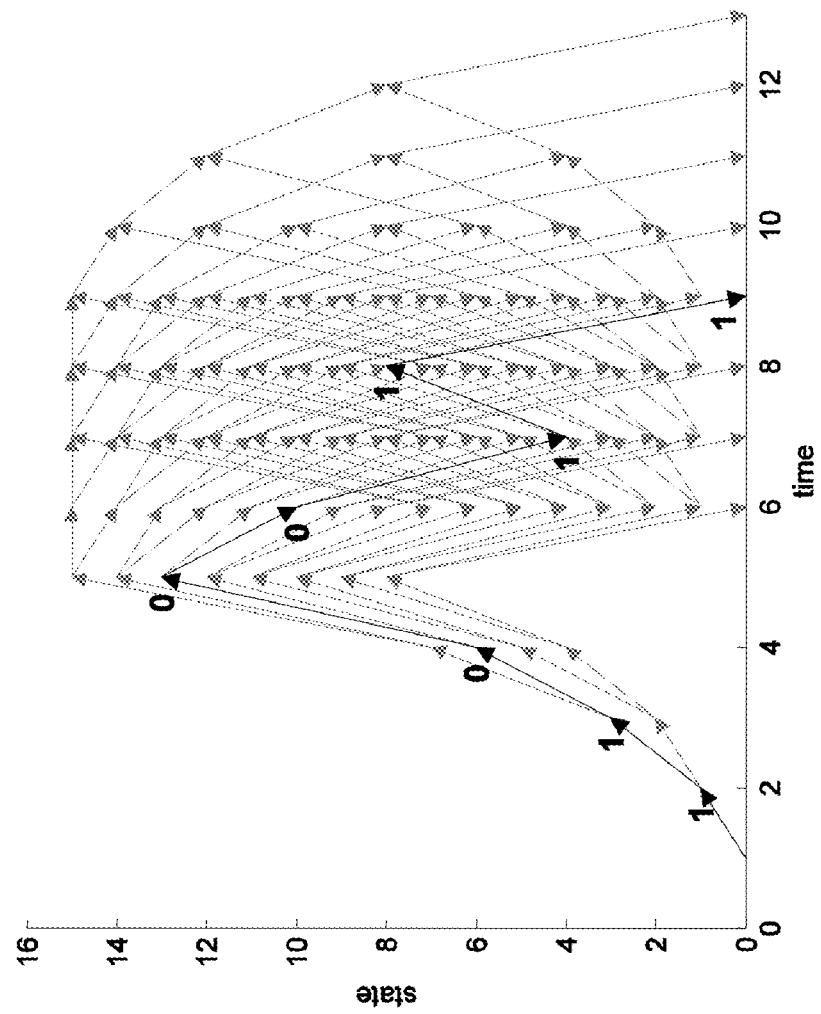
FIG. 2 is a diagram illustrating the state transitions for the same convolutional code as FIG. 1, but where the bits are transmitted using combined Binary Shift Phase Keying (BPSK) and Pulse Position Modulation (PPM), i.e., using a non-antipodal constellation.

If this same code is used for the above outlined scheme with combined PPM and BPSK, the distance properties of the dibits change to that of Table 2 and FIG. 2 gives the new trellis diagram showing that this code now has a dfree of 5 with one path. This gives asymptotically worse performance of 10 $\log_{10}(7/5)$ or 1.46 dBs, although in practice it's not quite as bad as this because there is only one path instead of two.

The performance of a convolutional code can be improved by searching for new generators and applying the dibit distance properties of the actual mapping that will be used, e.g., in this example by using the distances in Table 2 for the codes when searching. The search can be done by specially built hardware or by computer. Carrying out this search with Table 1 yielded the results given in Table 3. In the case of BPSK, the coded bits are used in a symmetric fashion so the generators can be used for either bit, i.e., (23, 35) gives the same performance as (35, 23).

TABLE 3

BPSK best dfree K = 5

| Octal generators (g1, g2) | dfree | # parallel paths |
| --- | --- | --- |
| (23, 27) | 7 | 3 |
| (31, 35) | 7 | 3 |
| (23, 33) | 7 | 2 |
| (31, 33) | 7 | 2 |
| (23, 35) | 7 | 2 |
| (31, 27) | 7 | 2 |

These examples above are consistent with published generators for K=5 convolutional codes.

Figure 3:
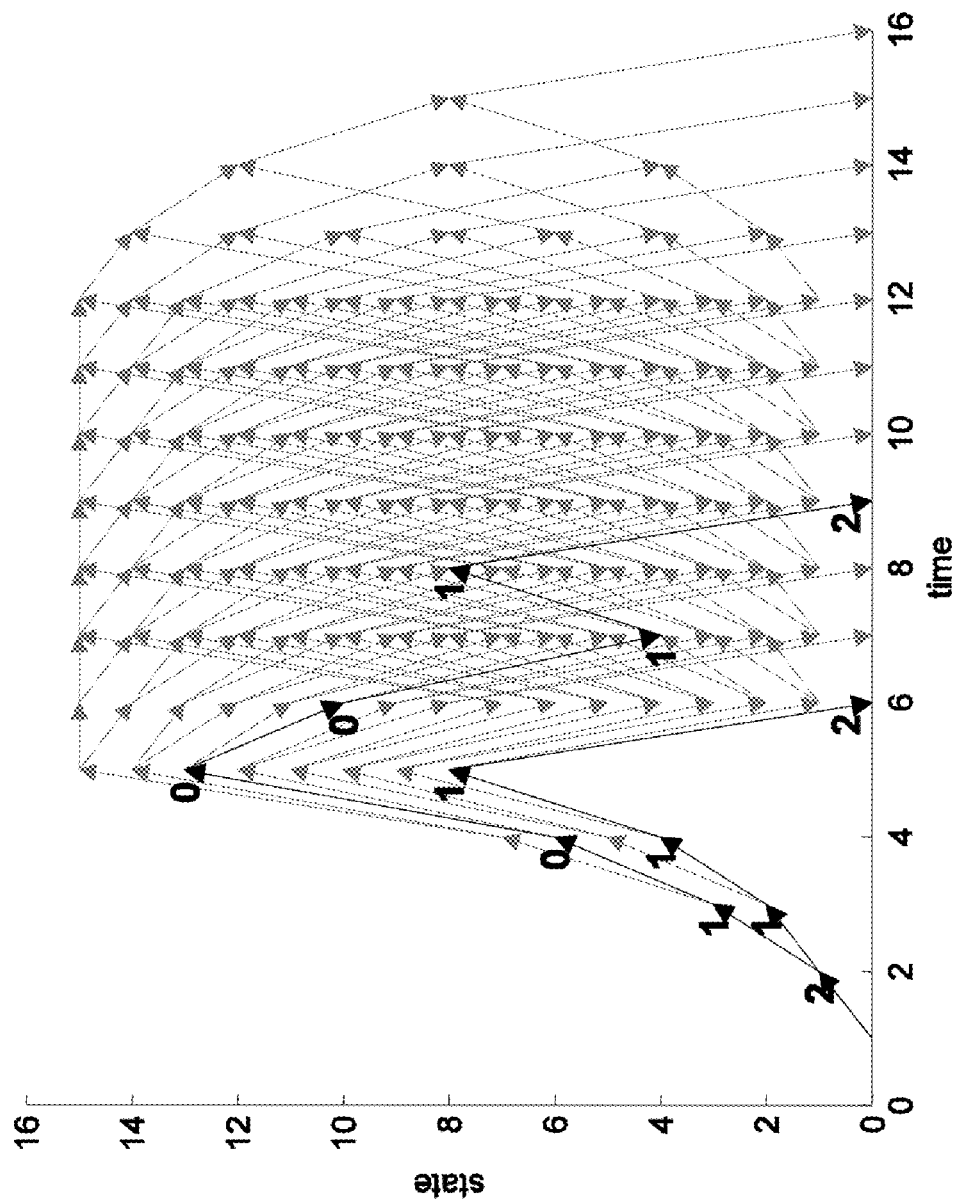
FIG. 3 is a diagram illustrating the state transitions for a non-systematic convolutional code which has better performance when used with a modulation scheme where the bits are transmitted using combined BPSK and PPM, i.e., a non-antipodal constellation.
Figure 4:
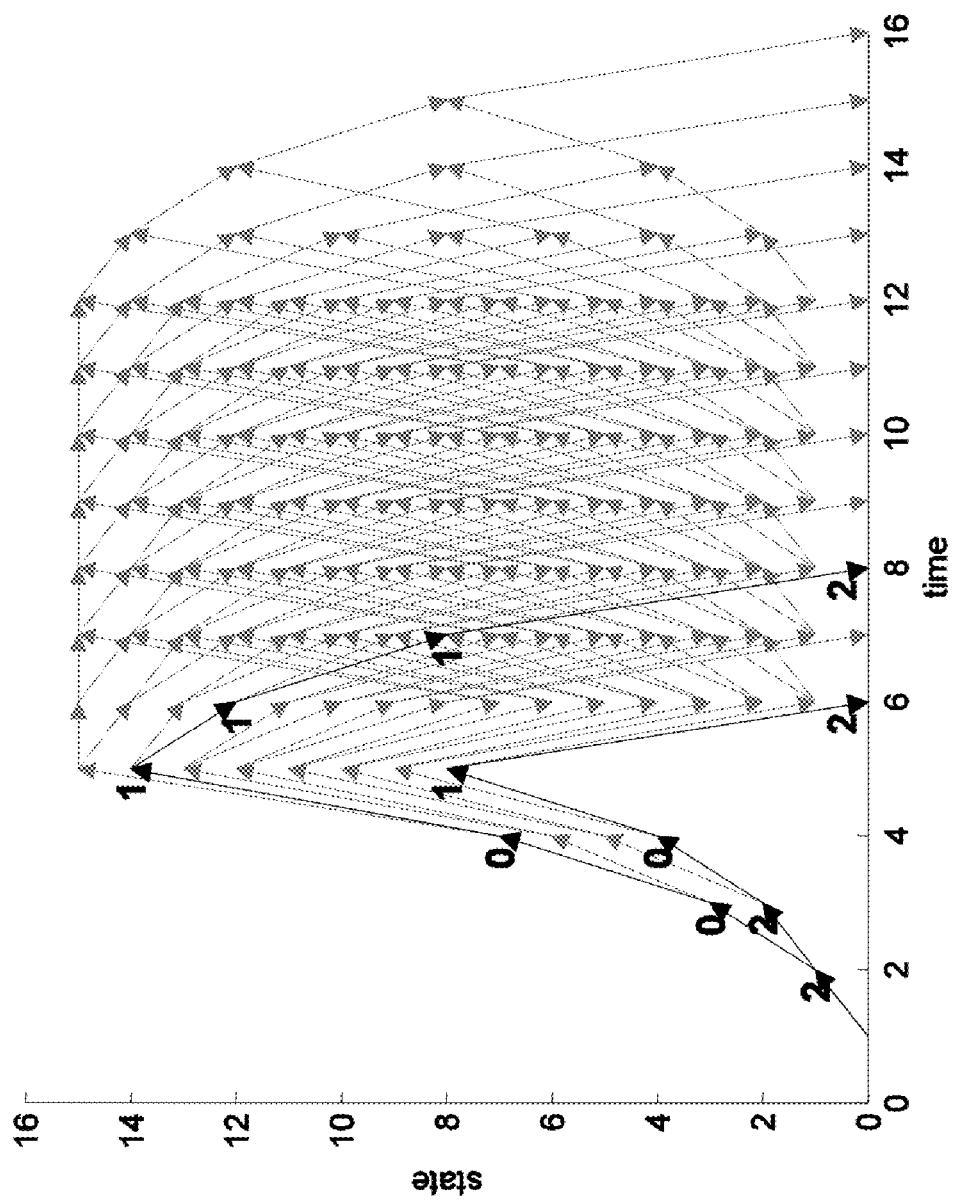
FIG. 4 is a diagram illustrating the state transitions for a systematic convolutional code which has better performance when used with a modulation scheme where the bits are transmitted using combined BPSK and PPM, i.e., a non-antipodal constellation.

Carrying out a search like this, but with the dibit weighting of Table 2 instead, i.e., using the actual weights that pertain to dibits coded with both PPM and BPSK gives the results shown in Table 4 for constraint length K=5. These are all the generator pairs which give a dfree of 7. The generators with 2 parallel paths would be expected to perform better than those with 3 parallel paths. FIG. 3 is an illustration of the paths for these distances for the code with generators (35, 16). FIG. 4 is the trellis diagram for the code with generators (33, 02).

TABLE 4

PPM/BPSK minimum dfree K = 5

| Octal generators (g1, g2) | dfree | # parallel paths |
| --- | --- | --- |
| (23, 04) | 7 | 3 |
| (31, 04) | 7 | 3 |
| (27, 04) | 7 | 3 |
| (35, 04) | 7 | 3 |
| (23, 10) | 7 | 2 |
| (31, 02) | 7 | 2 |
| (23, 16) | 7 | 2 |
| (31, 16) | 7 | 2 |
| (33, 10) | 7 | 2 |
| (33, 02) | 7 | 2 |
| (27, 16) | 7 | 2 |
| (35, 16) | 7 | 2 |

Figure 5:
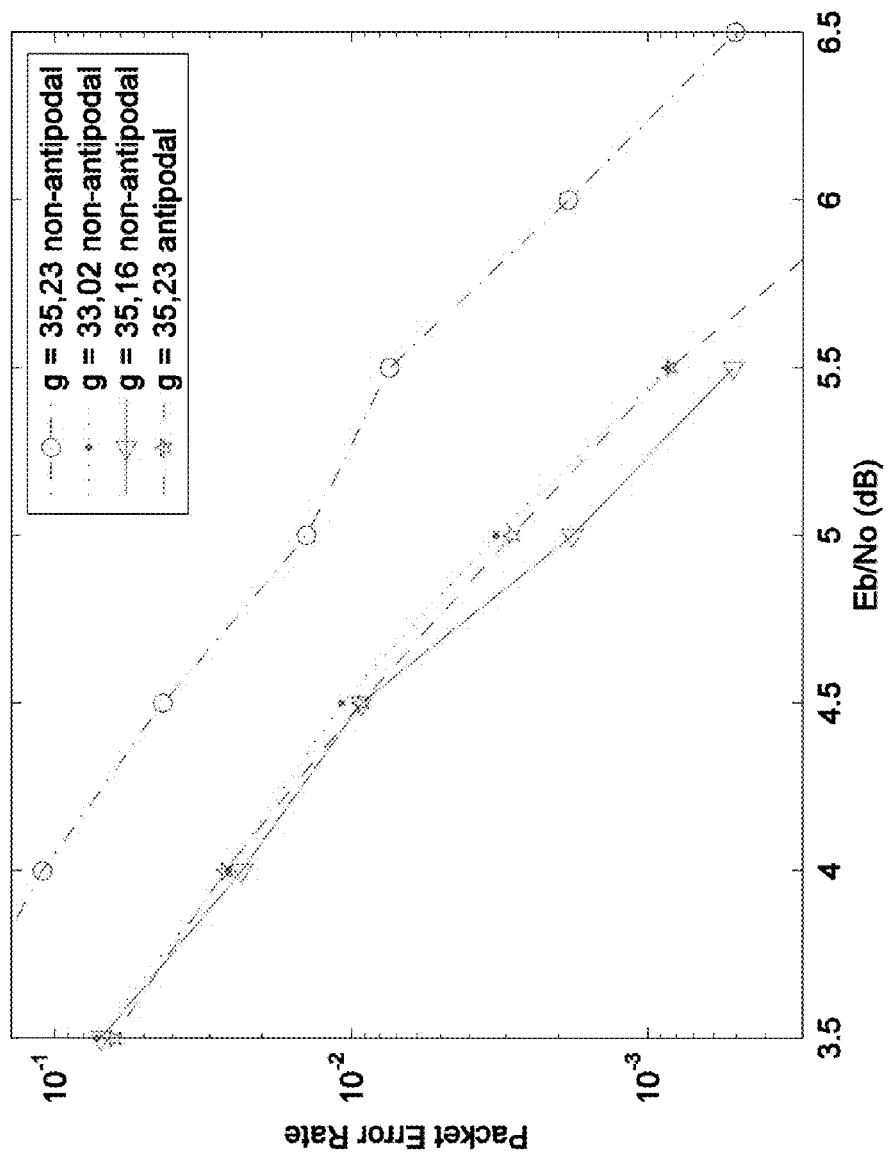
FIG. 5 is a graph showing the performance, in terms of packet error rate versus Eb/No, of various convolutional codes for both antipodal and non-antipodal constellations.
Figure 6:
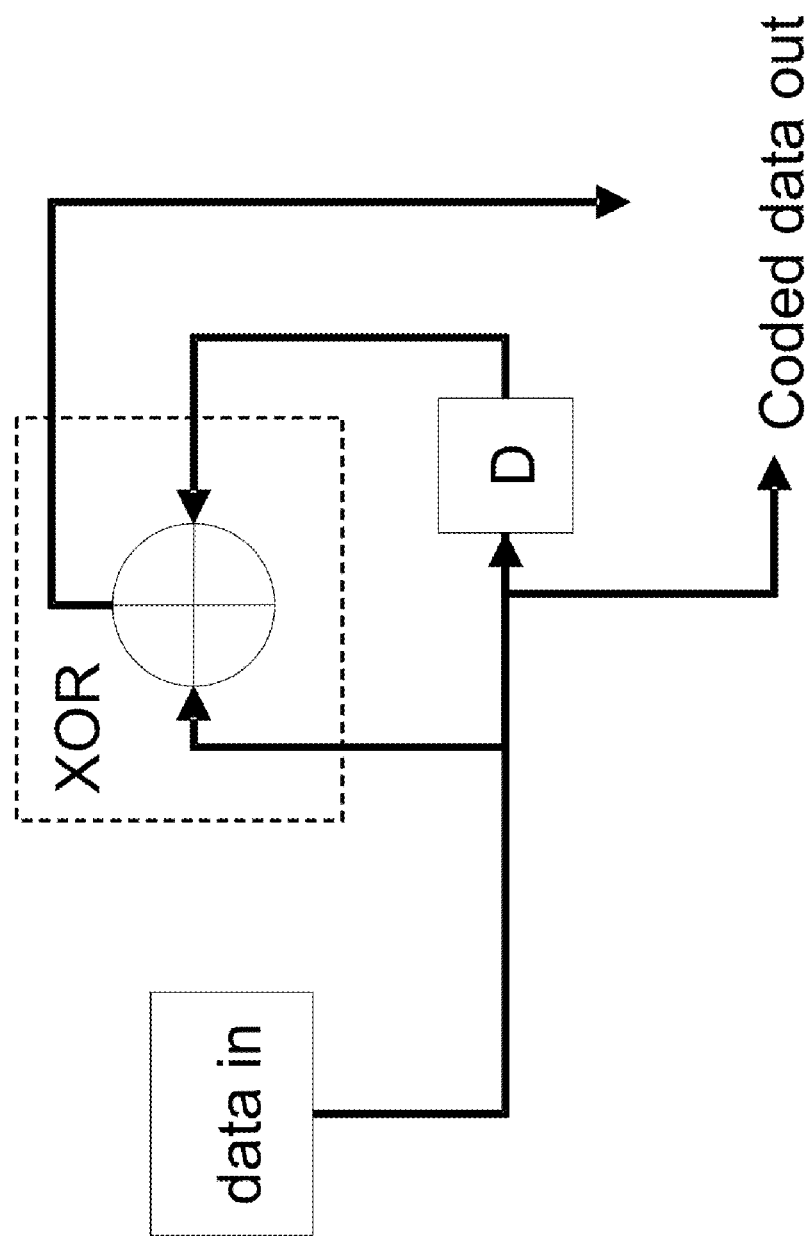
FIG. 6 is a block diagram showing the structure of a conventional convolutional encoder for a constraint length K=2.
Figure 7:
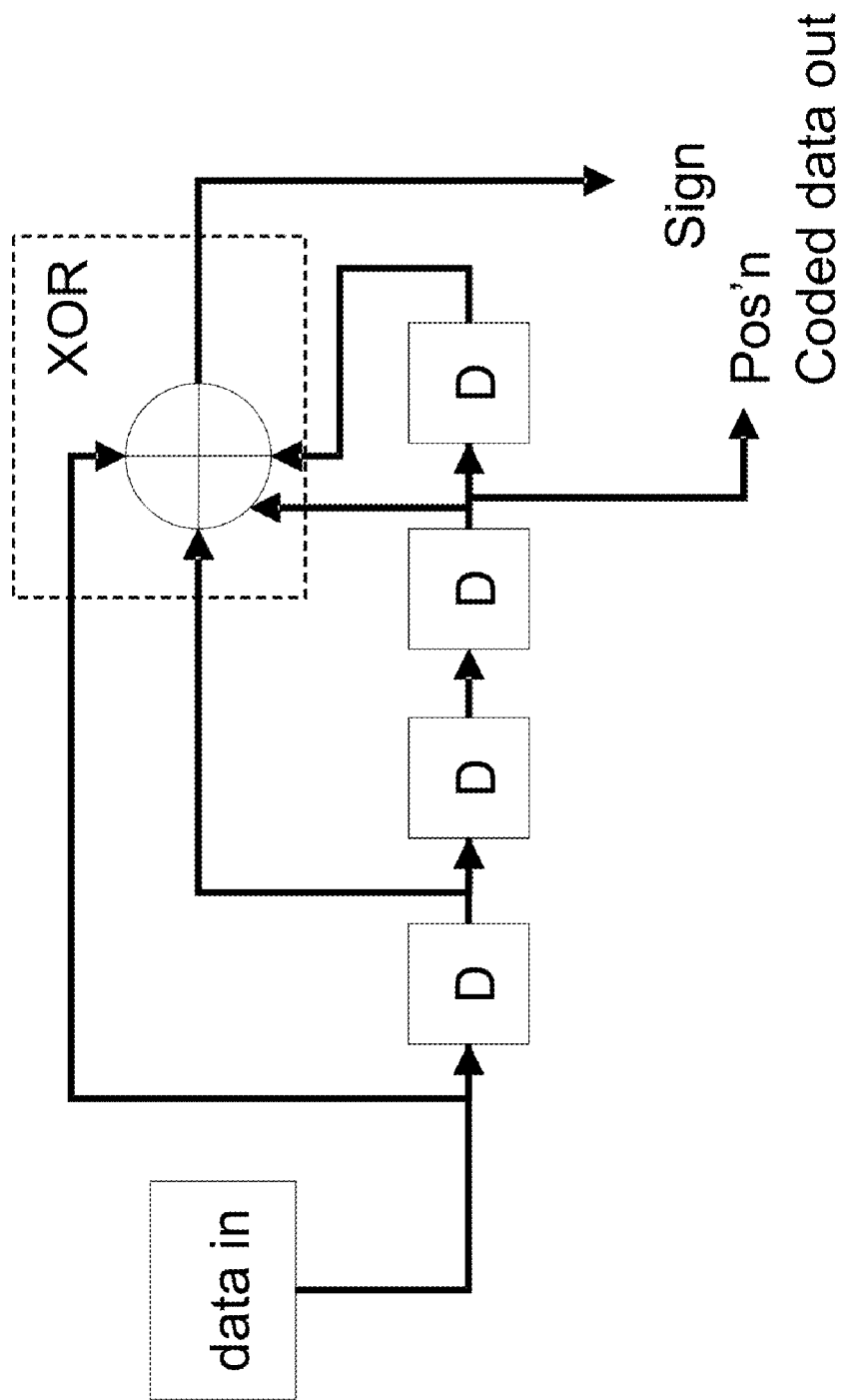
FIG. 7 is a block diagram showing the structure of a convolutional encoder for a constraint length K=5 where one of the output bits determines the polarity or sign of the output signal and the other determines its position.
Figure 8:
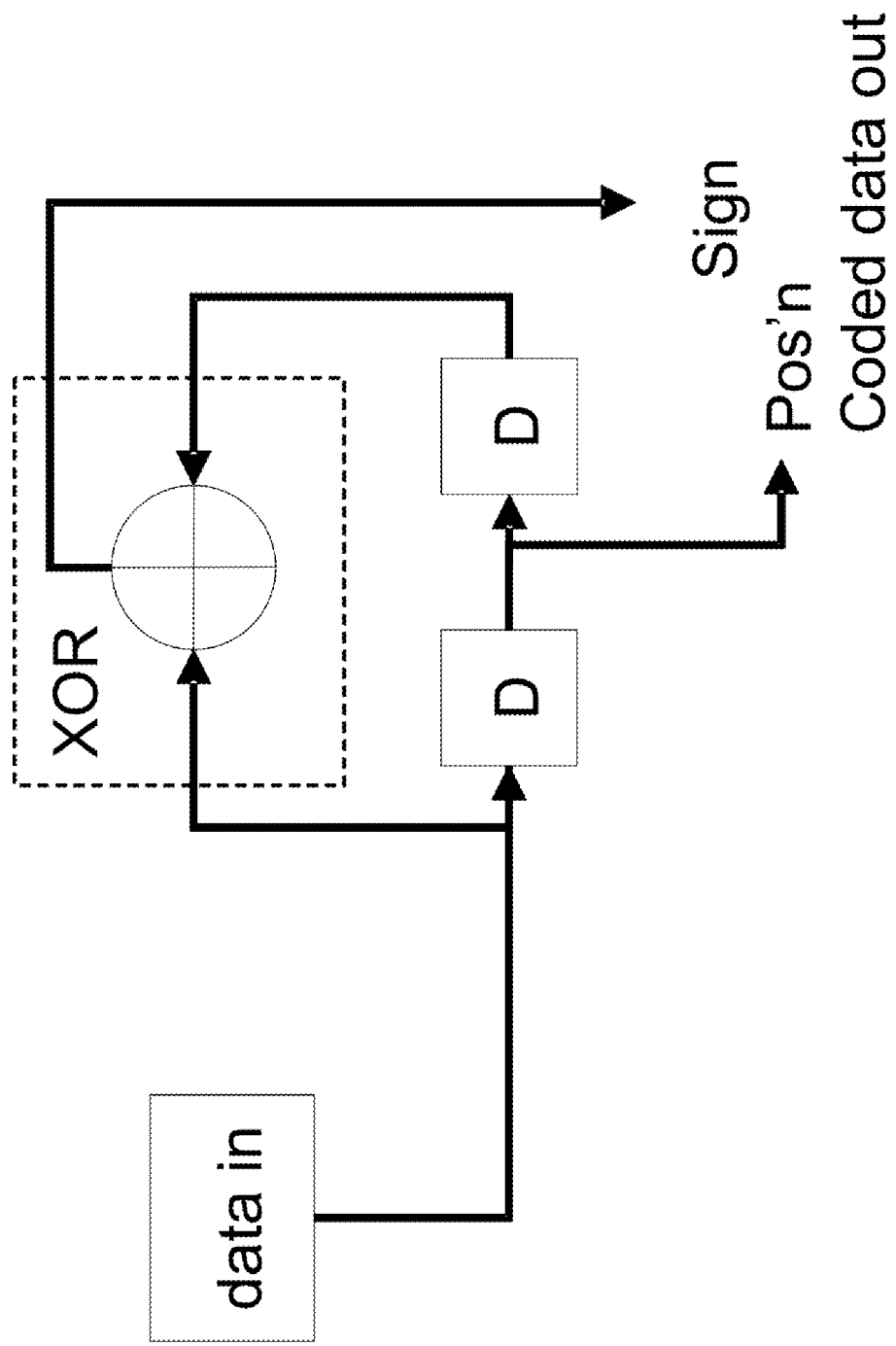
FIG. 8 is a block diagram showing the structure of a convolutional encoder for a constraint length K=3 where one of the output bits determines the polarity or sign of the output signal and the other determines its position.

In this case, the generators are not used symmetrically so that they cannot be swapped around, i.e., (23, 10) does not give the same performance as (10, 23). One nice thing about these particular minimum dfree generator pairs is that many of them are systematic. The expected performance of these systematic codes is expected to be as good as that of the non-systematic codes, because their dfree is the same, 7, and they have the same number of parallel paths, 2. For this search, the second generator, g2, was used to decide the position of the signal and g1 decided the sign. For all these optimum generator pairs which are systematic codes, the coded bit, which is merely a delayed copy of the input bit is always generated by g2, i.e., it is always the position. This allows a non-coherent receiver to decode the input bits directly by correctly deciding which is the correct position. FIG. 7 shows how one of these optimum generator pairs, (33, 02), can be used in this type of combined PPM/BPSK system. FIG. 5 shows that the error rate performance in AWGN of two of these new codes, (33, 02) and (35,16), used in a non-antipodal PPM/BPSK simulation versus a pure BPSK is approximately the same as one of the optimum codes (35, 23) used in a pure BPSK, antipodal simulation. This means that in this example code, Rate 1/2, K=5, we been able to have a combined PPM/BPSK coding system, with its attendant advantages for non-coherent demodulation, without sacrificing performance for a coherent system.

Table 5 shows the best 20 generator pairs for a rate 1/2 PPM/BPSK system when the constraint length, K=6. These are as good in terms of dfree and the number of parallel paths as the best BPSK codes. The best BPSK code has generators (53, 75) and its bit reversed equivalent (65, 57), which also has a dfree of 8 and only 1 parallel path. In this case the best systematic code has a dfree of 8 and 2 parallel paths so it's performance will be a little worse than the best code. A non-systematic code can still be decoded quite easily in the receiver from just one of the coded bits, just not quite as easily as a systematic one.

TABLE 5

| PPM/BPSK minimum dfree K = 6 | | |
|---|---|---|
| Octal generators (g1, g2) | dfree | # parallel paths |
| (045, 032) | 8 | 2 |
| (045, 036) | 8 | 2 |
| (051, 026) | 8 | 2 |
| (051, 036) | 8 | 2 |
| (055, 002) | 8 | 2 |
| (055, 020) | 8 | 2 |
| (057, 002) | 8 | 2 |
| (057, 034) | 8 | 2 |
| (063, 016) | 8 | 2 |
| (063, 034) | 8 | 2 |
| (067, 036) | 8 | 2 |
| (073, 036) | 8 | 2 |
| (075, 016) | 8 | 2 |
| (075, 020) | 8 | 2 |
| (077, 026) | 8 | 2 |
| (077, 032) | 8 | 2 |
| (053, 026) | 8 | 1 |
| (057, 032) | 8 | 1 |
| (065, 032) | 8 | 1 |
| (075, 026) | 8 | 1 |

Table 6 shows the best generators for a rate 1/2 PPM/BPSK system when the constraint length, K=7. Again, the best of these are as good as the best BPSK code, which has a dfree of 10 with 11 parallel paths.

TABLE 6

| PPM/BPSK minimum dfree K = 7 | | |
|---|---|---|
| Octal generators (g1, g2) | dfree | # parallel paths |
| (135, 054) | 9 | 1 |
| (161, 054) | 9 | 1 |
| (155, 062) | 9 | 1 |
| (175, 046) | 9 | 1 |
| (107, 032) | 9 | 1 |
| (135, 032) | 9 | 1 |
| (137, 062) | 9 | 1 |
| (133, 046) | 9 | 1 |
| (163, 056) | 10 | 12 |
| (147, 072) | 10 | 12 |
| (135, 056) | 10 | 12 |
| (135, 072) | 10 | 12 |
| (117, 042) | 10 | 11 |
| (171, 042) | 10 | 11 |

TABLE 6-continued

| PPM/BPSK minimum dfree K = 7 | | |
|---|---|---|
| Octal generators (g1, g2) | dfree | # parallel paths |
| (155, 042) | 10 | 11 |
| (133, 042) | 10 | 11 |

Table 7 shows the best generators of a rate 1/2 systematic code for a PPM/BPSK system when the constraint length, K=7. The performance of these will be a little worse than the non-systematic codes.

TABLE 7

| PPM/BPSK minimum dfree K = 7 | | |
|---|---|---|
| Octal generators (g1, g2) | dfree | # parallel paths |
| (113, 040) | 9 | 4 |
| (133, 004) | 9 | 4 |
| (137, 004) | 9 | 4 |
| (151, 002) | 9 | 4 |
| (153, 002) | 9 | 4 |
| (153, 040) | 9 | 4 |
| (155, 020) | 9 | 4 |
| (175, 020) | 9 | 4 |

Carrying out another search like this, i.e., again with the dibit weighting of Table 2, using the actual weights that pertain to dibits coded with both PPM and BPSK gives the results shown in Table 8 for a code of constraint length K=3. There are two generator pairs which give the maximum dfree of 5. Both of these have just one path. This will give the same performance as the best BPSK system where the best code has generators (5, 7) which, in a BPSK modulation scheme, also has just one path for a dfree of 5.

TABLE 8

| PPM/BPSK minimum dfree K = 3 | | |
|---|---|---|
| Octal generators (g1, g2) | dfree | # parallel paths |
| (5, 2) | 5 | 1 |
| (7, 2) | 5 | 1 |

This same procedure and search can be carried out in the same way for other constraint lengths and codes with 1/R or n/m other than 1/2. All that is required is that the distance is calculated for each combination of PPM and BPSK and the search for minimum dfree is carried out for all possible generators using this distance data.

Figure 9:
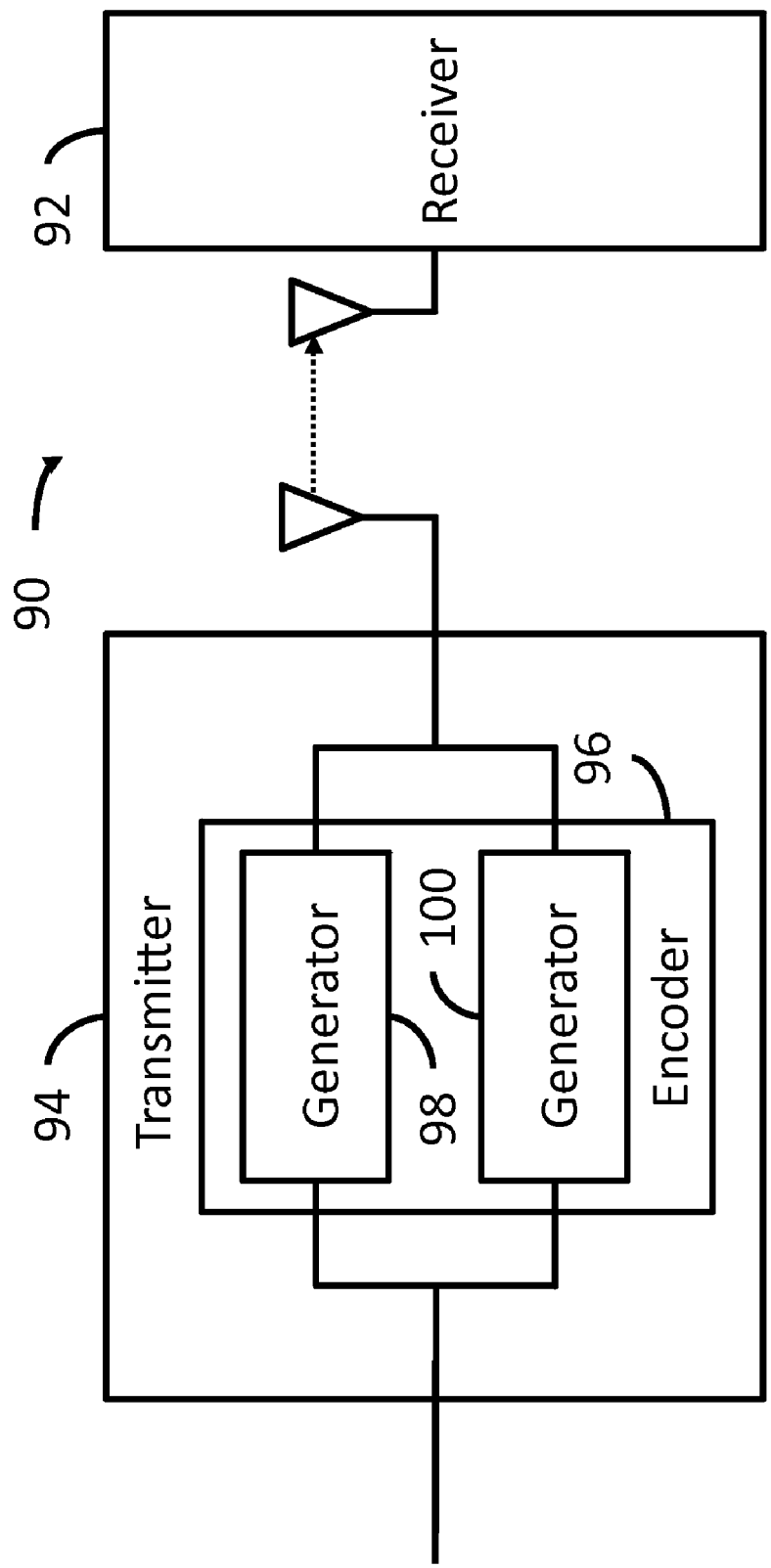
FIG. 9 is a general communication system within which my invention may be advantageously incorporated.

FIG. 9 shows, as one exemplary embodiment, the subject matter discussed in the preceding paragraphs integrated into a communication device 90 for transmitting data. The communication device 90 includes, as is typically the case, a receiver 92 discussed above and a transmitter 94 which includes a convolutional encoder 96. The convolutional encoder 96 contains two or more generators 98 and 100, where the output of one of the generators 98 can be used to determine the polarity or sign of the transmitted signal, and the output of another generator 100 can be used to determine the position of the transmitted signal. The octal values of the generators 98 and 100 may be chosen, using the technique described above, in order to maximize the dfree of the convolutional code when used with the transmitter 94. In one embodiment, the transmitter 94 transmits wirelessly. Preferably, the transmitter 94 is an ultra wideband transmitter. Additionally, the convolutional encoder 96 can be systematic in any of the embodiments. As indicated in Table 8, above, one embodiment could have the octal values of the generators 98 and 100 set to 5 and 2, respectively. Alternatively, a different embodiment could have the octal values of the generators 98 and 100 set to 7 and 2, respectively.

In the preceding description, certain specific details of the disclosed embodiment such as architecture, example codes, interfaces and techniques, etc, are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion.

What is claimed is:

1. Apparatus adapted to transmit a sequence of data bits, the apparatus comprising:
    a transmitter comprising:
        an encoder comprising a first generator and a second generator, adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum code which is adapted to determine only said transmit polarity; and
    wherein the transmitter is adapted to transmit each bit of said sequence of data bits in accordance with said respective transmit polarity output of said first generator and said respective transmit position output of said second generator.

2. The apparatus of claim 1 wherein said convolutional code is systematic.

3. The apparatus of claim 1 wherein the octal value for said first generator is 5, and the octal value for said second generator is 2.

4. The apparatus of claim 1 wherein the octal value of each of said generators has also been chosen so as to minimize a number of parallel paths.

5. Apparatus adapted to transmit a sequence of data bits, the apparatus comprising:
    a transmitter comprising:
        an encoder comprising a first generator and a second generator, adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum code which is adapted to determine only said transmit polarity; and
    wherein the transmitter is adapted to transmit each bit of said sequence of data bits in accordance with said respective transmit polarity output of said first generator and said respective transmit position output of said second generator.

6. The apparatus of claim 5 wherein said convolutional code is systematic.

7. The apparatus of claim 5 wherein the octal value for said first generator is 5, and the octal value for said second generator is 2.

8. The apparatus of claim 5 wherein the octal value of each of said generators has also been chosen so as to minimize a number of parallel paths.

9. Apparatus adapted to transmit a sequence of data bits, the apparatus comprising:
    a transmitter comprising:
        an encoder comprising a first generator and a second generator, adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum BPSK-only code which is adapted to determine only said transmit polarity; and
    wherein the transmitter is adapted to transmit each bit of said sequence of data bits in accordance with said respective transmit polarity output of said first generator and said respective transmit position output of said second generator.

10. The apparatus of claim 9 wherein said convolutional code is systematic.

11. The apparatus of claim 9 wherein the octal value for said first generator is 5, and the octal value for said second generator is 2.

12. The apparatus of claim 9 wherein the octal value of each of said generators has also been chosen so as to minimize a number of parallel paths.

13. Apparatus adapted to transmit a sequence of data bits, the apparatus comprising:
    a transmitter comprising:
        an encoder comprising a first generator and a second generator, adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum BPSK-only code which is adapted to determine only said transmit polarity; and
    wherein the transmitter is adapted to transmit each bit of said sequence of data bits in accordance with said respective transmit polarity output of said first generator and said respective transmit position output of said second generator.

14. The apparatus of claim 13 wherein said convolutional code is systematic.

15. The apparatus of claim 13 wherein the octal value for said first generator is 5, and the octal value for said second generator is 2.

16. The apparatus of claim 13 wherein the octal value of each of said generators has also been chosen so as to minimize a number of parallel paths.

17. A transmitter adapted to transmit a sequence of data bits, the transmitter comprising:
an encoder comprising a first generator and a second generator, adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum code which is adapted to determine only said transmit polarity;
wherein the transmitter is adapted to transmit each bit of said sequence of data bits in accordance with said respective transmit polarity output of said first generator and said respective transmit position output of said second generator.

18. The transmitter of claim 17 wherein said convolutional code is systematic.

19. The transmitter of claim 17 wherein the octal value for said first generator is 5, and the octal value for said second generator is 2.

20. The transmitter of claim 17 wherein the octal value of each of said generators has also been chosen so as to minimize a number of parallel paths.

21. A transmitter adapted to transmit a sequence of data bits, the transmitter comprising:
an encoder comprising a first generator and a second generator, adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum code which is adapted to determine only said transmit polarity;
wherein the transmitter is adapted to transmit each bit of said sequence of data bits in accordance with said respective transmit polarity output of said first generator and said respective transmit position output of said second generator.

22. The transmitter of claim 21 wherein said convolutional code is systematic.

23. The transmitter of claim 21 wherein the octal value for said first generator is 5, and the octal value for said second generator is 2.

24. The transmitter of claim 21 wherein the octal value of each of said generators has also been chosen so as to minimize a number of parallel paths.

25. A transmitter adapted to transmit a sequence of data bits, the transmitter comprising:
an encoder comprising a first generator and a second generator, adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum BPSK-only code which is adapted to determine only said transmit polarity;
wherein the transmitter is adapted to transmit each bit of said sequence of data bits in accordance with said respective transmit polarity output of said first generator and said respective transmit position output of said second generator.

26. The transmitter of claim 25 wherein said convolutional code is systematic.

27. The transmitter of claim 25 wherein the octal value for said first generator is 5, and the octal value for said second generator is 2.

28. The transmitter of claim 25 wherein the octal value of each of said generators has also been chosen so as to minimize a number of parallel paths.

29. A transmitter adapted to transmit a sequence of data bits, the transmitter comprising:
an encoder comprising a first generator and a second generator, adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum BPSK-only code which is adapted to determine only said transmit polarity;
wherein the transmitter is adapted to transmit each bit of said sequence of data bits in accordance with said respective transmit polarity output of said first generator and said respective transmit position output of said second generator.

30. The transmitter of claim 29 wherein said convolutional code is systematic.

31. The transmitter of claim 29 wherein the octal value for said first generator is 5, and the octal value for said second generator is 2.

32. The transmitter of claim 29 wherein the octal value of each of said generators has also been chosen so as to minimize a number of parallel paths.

33. A transmitter for transmitting a sequence of data bits comprising:
an encoder comprising:
a first generator, having a transmit polarity output, adapted to determine a transmit polarity of a respective one of said bits; and
a second generator, having a transmit position output, adapted to determine a transmit position of said respective bit;
said encoder adapted to generate from said sequence of data bits a convolutional code comprising an output of at least said first and said second generators;
wherein an octal value of each of said generators has been chosen so as to maximize the dfree of said code while providing substantially the same performance as an optimum code which is adapted to determine only said transmit polarity;
wherein said transmitter is adapted to transmit each bit of said sequence of data bits in accordance with said respective transmit polarity output of said first generator and said respective transmit position output of said second generator.

34. The transmitter of claim 33 wherein said convolutional code is systematic.

35. The transmitter of claim 33 wherein the octal value for said first generator is 5, and the octal value for said second generator is 2.

36. The transmitter of claim 33 wherein the octal value of each of said generators has also been chosen so as to minimize a number of parallel paths.

37. A transmitter for transmitting a sequence of data bits comprising:
an encoder comprising:
a first generator, having a transmit polarity output, adapted to determine a transmit polarity of a respective one of said bits; and
a second generator, having a transmit position output, adapted to determine a transmit position of said respective bit;
said encoder adapted to generate from said sequence of data bits a convolutional code comprising an output of at least said first and said second generators;
wherein an octal value of each of said generators has been chosen so as to provide substantially the same performance as an optimum code which is adapted to determine only said transmit polarity;
wherein said transmitter is adapted to transmit each bit of said sequence of data bits in accordance with said respective transmit polarity output of said first generator and said respective transmit position output of said second generator.

38. The transmitter of claim 37 wherein said convolutional code is systematic.

39. The transmitter of claim 37 wherein the octal value for said first generator is 5, and the octal value for said second generator is 2.

40. The transmitter of claim 37 wherein the octal value of each of said generators has also been chosen so as to minimize a number of parallel paths.

41. A transmitter for transmitting a sequence of data bits comprising:
an encoder comprising:
a first generator, having a transmit polarity output, adapted to determine a transmit polarity of a respective one of said bits; and
a second generator, having a transmit position output, adapted to determine a transmit position of said respective bit;
said encoder adapted to generate from said sequence of data bits a combined binary phase shift keying and pulse position modulation (BPSK+PPM) convolutional code comprising an output of at least said first and said second generators;
wherein an octal value of each of said generators has been chosen so as to maximize the dfree of said code while providing substantially the same performance as an optimum BPSK-only code which is adapted to determine only said transmit polarity;
wherein said transmitter is adapted to transmit each bit of said sequence of data bits in accordance with said respective transmit polarity output of said first generator and said respective transmit position output of said second generator.

42. The transmitter of claim 41 wherein said convolutional code is systematic.

43. The transmitter of claim 41 wherein the octal value for said first generator is 5, and the octal value for said second generator is 2.

44. The transmitter of claim 41 wherein the octal value of each of said generators has also been chosen so as to minimize a number of parallel paths.

45. A transmitter for transmitting a sequence of data bits comprising:
an encoder comprising:
a first generator, having a transmit polarity output, adapted to determine a transmit polarity of a respective one of said bits; and
a second generator, having a transmit position output, adapted to determine a transmit position of said respective bit;
said encoder adapted to generate from said sequence of data bits a combined binary phase shift keying and pulse position modulation (BPSK+PPM) convolutional code comprising an output of at least said first and said second generators;
wherein an octal value of each of said generators has been chosen so as to provide substantially the same performance as an optimum BPSK-only code which is adapted to determine only said transmit polarity;
wherein said transmitter is adapted to transmit each bit of said sequence of data bits in accordance with said respective transmit polarity output of said first generator and said respective transmit position output of said second generator.

46. The transmitter of claim 45 wherein said convolutional code is systematic.

47. The transmitter of claim 45 wherein the octal value for said first generator is 5, and the octal value for said second generator is 2.

48. The transmitter of claim 45 wherein the octal value of each of said generators has also been chosen so as to minimize a number of parallel paths.

49. A transmitter that is adapted to perform a transmission of a sequence of data bits, said transmitter comprising:
first and second generators adapted to generate from said sequence of data bits a convolutional code comprising an output of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum code which is adapted to determine only said transmit polarity; and
wherein each bit of said sequence of data bits is transmitted in accordance with said respective transmit polarity output of said first generator and said respective transmit position output of said second generator.

50. The transmitter of claim 49 wherein said convolutional code is systematic.

51. The transmitter of claim 49 wherein the octal value for said first generator is 5, and the octal value for said second generator is 2.

52. The transmitter of claim 49 wherein the octal value of each of said generators has also been chosen so as to minimize a number of parallel paths.

53. A transmitter that is adapted to perform a transmission of a sequence of data bits, said transmitter comprising:
first and second generators adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum code which is adapted to determine only said transmit polarity; and wherein each bit of said sequence of data bits is transmitted in accordance with said respective transmit polarity output of said first generator and said respective transmit position output of said second generator.

54. The transmitter of claim 53 wherein said convolutional code is systematic.

55. The transmitter of claim 53 wherein the octal value for said first generator is 5, and the octal value for said second generator is 2.

56. The transmitter of claim 53 wherein the octal value of each of said generators has also been chosen so as to minimize a number of parallel paths.

57. A transmitter that is adapted to perform a transmission of a sequence of data bits, said transmitter comprising:

first and second generators adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum BPSK-only code which is adapted to determine only said transmit polarity; and wherein each bit of said sequence of data bits is transmitted in accordance with said respective transmit polarity output of said first generator and said respective transmit position output of said second generator.

58. The transmitter of claim 57 wherein said convolutional code is systematic.

59. The transmitter of claim 57 wherein the octal value for said first generator is 5, and the octal value for said second generator is 2.

60. The transmitter of claim 57 wherein the octal value of each of said generators has also been chosen so as to minimize a number of parallel paths.

61. A transmitter that is adapted to perform a transmission of a sequence of data bits, said transmitter comprising:

first and second generators adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum BPSK-only code which is adapted to determine only said transmit polarity; and wherein each bit of said sequence of data bits is transmitted in accordance with said respective transmit polarity output of said first generator and said respective transmit position output of said second generator.

62. The transmitter of claim 61 wherein said convolutional code is systematic.

63. The transmitter of claim 61 wherein the octal value for said first generator is 5, and the octal value for said second generator is 2.

64. The transmitter of claim 61 wherein the octal value of each of said generators has also been chosen so as to minimize a number of parallel paths.

65. A transmitter to transmit a sequence of data bits, said transmitter comprising:

first and second generators adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum code which is adapted to determine only said transmit polarity; and wherein each bit of said sequence of data bits is transmitted in accordance with said respective transmit polarity output of said first generator and said respective transmit position output of said second generator.

66. The transmitter of claim 65 wherein said convolutional code is systematic.

67. The transmitter of claim 65 wherein the octal value for said first generator is 5, and the octal value for said second generator is 2.

68. The transmitter of claim 65 wherein the octal value of each of said generators has also been chosen so as to minimize a number of parallel paths.

69. A transmitter to transmit a sequence of data bits, said transmitter comprising:

first and second generators adapted to generate from said sequence of data bits a convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum code which is adapted to determine only said transmit polarity; and wherein each bit of said sequence of data bits is transmitted in accordance with said respective transmit polarity output of said first generator and said respective transmit position output of said second generator.

70. The transmitter of claim 69 wherein said convolutional code is systematic.

71. The transmitter of claim 69 wherein the octal value for said first generator is 5, and the octal value for said second generator is 2.

72. The transmitter of claim 69 wherein the octal value of each of said generators has also been chosen so as to minimize a number of parallel paths.

73. A transmitter to transmit a sequence of data bits, said transmitter comprising:

first and second generators adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to maximize the dfree of said code while providing substantially the same performance as an optimum BPSK-only code which is adapted to determine only said transmit polarity; and wherein each bit of said sequence of data bits is transmitted in accordance with said respective transmit polarity output of said first generator and said respective transmit position output of said second generator.

74. The transmitter of claim 73 wherein said convolutional code is systematic.

75. The transmitter of claim 73 wherein the octal value for said first generator is 5, and the octal value for said second generator is 2.

76. The transmitter of claim 73 wherein the octal value of each of said generators has also been chosen so as to minimize a number of parallel paths.

77. A transmitter to transmit a sequence of data bits, said transmitter comprising:

first and second generators adapted to generate from said sequence of data bits a combined binary phase shift keying and pulse position modulation (BPSK+PPM) convolutional code comprising an output of each of said first and second generators, the output of said first generator adapted to determine a transmit polarity of a respective one of said bits and the output of said second generator adapted to determine a transmit position of said respective bit, wherein an octal value of each of said generators has been chosen so as to provide substantially the same performance as an optimum BPSK-only code which is adapted to determine only said transmit polarity; and wherein each bit of said sequence of data bits is transmitted in accordance with said respective transmit polarity output of said first generator and said respective transmit position output of said second generator.

78. The transmitter of claim 77 wherein said convolutional code is systematic.

79. The transmitter of claim 77 wherein the octal value for said first generator is 5, and the octal value for said second generator is 2.

80. The transmitter of claim 77 wherein the octal value of each of said generators has also been chosen so as to minimize a number of parallel paths.

* * * * *